United States Patent
Zhu et al.

(10) Patent No.: US 11,367,785 B2
(45) Date of Patent: Jun. 21, 2022

(54) LATERAL INSULATED GATE BIPOLAR TRANSISTOR WITH LOW TURN-ON OVERSHOOT CURRENT

(71) Applicant: SOUTHEAST UNIVERSITY, Jiangsu (CN)

(72) Inventors: Jing Zhu, Jiangsu (CN); Ankang Li, Jiangsu (CN); Long Zhang, Jiangsu (CN); Weifeng Sun, Jiangsu (CN); Shengli Lu, Jiangsu (CN); Longxing Shi, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 0 days.

(21) Appl. No.: 17/606,216

(22) PCT Filed: Mar. 31, 2020

(86) PCT No.: PCT/CN2020/082251
§ 371 (c)(1),
(2) Date: Oct. 25, 2021

(87) PCT Pub. No.: WO2020/224358
PCT Pub. Date: Nov. 12, 2020

(65) Prior Publication Data
US 2022/0157975 A1    May 19, 2022

(30) Foreign Application Priority Data
May 5, 2019    (CN) .......................... 201910370872.X

(51) Int. Cl.
*H01L 29/73*    (2006.01)
*H01L 29/739*    (2006.01)
*H01L 29/10*    (2006.01)

(52) U.S. Cl.
CPC ...... *H01L 29/7394* (2013.01); *H01L 29/1095* (2013.01)

(58) Field of Classification Search
CPC ....... H01L 29/42; H01L 29/423; H01L 29/73; H01L 29/739; H01L 29/7394
(Continued)

(56) References Cited

U.S. PATENT DOCUMENTS

2017/0236904 A1*    8/2017 Yang .................. H01L 29/0804
438/135

FOREIGN PATENT DOCUMENTS

CN    104916674 A    9/2015
CN    105826367 A    8/2016
(Continued)

OTHER PUBLICATIONS

Office Action with English translation for corresponding CN Application 201910370872.X dated Mar. 24, 2021, 12 pages.
(Continued)

*Primary Examiner* — Fazli Erdem
(74) *Attorney, Agent, or Firm* — Muncy, Geissler, Olds and Lowe, P.C.

(57) ABSTRACT

A lateral insulated gate bipolar transistor (IGBT) with a low turn-on overshoot current is provided to reduce a peak value of a current flowing through a device during turn-on of a second gate pulse while preventing a current capability and a withstand voltage capability from being degraded. The lateral IGBT includes: a buried oxygen arranged on a P-type substrate, an N-type drift region arranged on the buried oxygen, on which a P-type body region and an N-type buffer region are arranged, a P-type collector region arranged in the N-type buffer region, a field oxide layer arranged above the N-type drift region, a P-type well region arranged in the P-type body region, and a P-type emitter region and an
(Continued)

emitter region arranged in the P-type well region, where inner boundaries of the foregoing 4 regions are synchronously recessed to form a pinch-off region. A gate oxide layer is arranged on a surface of the P-type body region, and a polysilicon gate is arranged on the gate oxide layer. The polysilicon gate includes a first gate located above the surface of the P-type body region and a second gate located above the pinch-off region and the N-type drift region. The first gate is connected to a first gate resistor, and the second gate is connected to a second gate resistor.

4 Claims, 15 Drawing Sheets

(58) Field of Classification Search
USPC .......................................................... 257/139
See application file for complete search history.

(56) References Cited

FOREIGN PATENT DOCUMENTS

| | | |
|---|---|---|
| CN | 107293585 A | 10/2017 |
| CN | 110190120 A | 8/2019 |

OTHER PUBLICATIONS

Notification of Grant with granted claims with English translation for corresponding CN Application 201910370872.X dated Aug. 24, 2021, 5 pages.

* cited by examiner

LATERAL INSULATED GATE BIPOLAR TRANSISTOR WITH LOW TURN-ON OVERSHOOT CURRENT

TECHNICAL FIELD

The present invention mainly relates to the technical field of power semiconductor devices, and is a lateral insulated gate bipolar transistor with a low turn-on overshoot current, particularly suitable for a monolithic integrated intelligent power chip.

BACKGROUND

A silicon-on-insulator lateral insulated gate bipolar transistor (SOI-LIGBT) has advantages such as easy integration, a high withstand voltage, and a high switching speed, and is widely applicable to monolithic integrated intelligent power chips. A current capability of an SOI-LIGBT device is a key factor affecting power consumption and the area of a monolithic integrated intelligent power chip. To improve the current capability of the device, a U-shaped channel may be used to increase an effective channel width, thereby increasing the current capability of the device. However, the U-shaped channel inevitably increases the area of the gate, resulting in an increase in gate capacitance. In a double pulse test, an SOI-LIGBT device using a U-shaped channel has obvious a gate voltage overshoot, causing a peak value of a current flowing through the device to be excessively high during turn-on of a second pulse. An excessively high current peak value may increase the turn-on loss of the device, and even cause latch-up and damage the device. To reduce the peak value of a turn-on current, a method of increasing gate resistance may be used. However, such a method may reduce the switching speed of the device and increase the turn-on loss.

Therefore, a problem that needs to be resolved in applying a U-shaped channel SOI-LIGBT device to a monolithic integrated power chip is to reduce a current peak value of a U-shaped channel SOI-LIGBT device during turn-on of a second pulse without increasing the turn-on loss while preventing a current capability of the device from being degraded.

SUMMARY

To resolve the foregoing problem, the present invention provides a lateral insulated gate bipolar transistor (IGBT) with a low turn-on overshoot current. The structure significantly reduces a current peak value of the device during double-pulse turn-on while keeping a withstand voltage and a current capability of the device.

The present invention provides the following technical solution:

A lateral IGBT with a low turn-on overshoot current is provided, including: a P-type substrate, where a buried oxide layer is arranged on the P-type substrate, an N-type drift region is arranged on the buried oxide layer, a P-type body region and an N-type buffer region are respectively arranged on both sides of the N-type drift region, a field oxide layer is arranged above the N-type drift region, a heavily doped P-type collector region is arranged in the N-type buffer region, a collector metal is connected to the heavily doped P-type collector region, the collector metal is connected to a first peripheral terminal, a P-type well region is arranged in the P-type body region, a heavily doped P-type emitter region and a heavily doped N-type emitter region are arranged in the P-type well region, the heavily doped P-type emitter region and the heavily doped N-type emitter region are connected to an emitter metal, the emitter metal is connected to a second peripheral terminal, and inner boundaries of the P-type body region, the P-type well region, the heavily doped P-type emitter region, and the heavily doped N-type emitter region are synchronously recessed to form a pinch-off region; a gate oxide layer is arranged on a surface of the P-type body region, the gate oxide layer extends into an upper part of the N-type drift region and covers the pinch-off region, where a polysilicon gate is arranged on the gate oxide layer, and the polysilicon gate includes a first gate located above the surface of the P-type body region and a second gate located above the pinch-off region and the N-type drift region, a gap is arranged between the first gate and the second gate, and the first gate and the second gate are separated by the gap; the first gate is covered with a first gate metal, and the first gate metal is connected to a third peripheral terminal through a first polysilicon resistor; and the second gate is covered with a second gate metal, and the second gate metal is connected to the third peripheral terminal through a second polysilicon resistor.

Compared with the prior art, the present invention has the following advantages:

In a rising phase of a second gate pulse signal of a double pulse gate signal, a large quantity of holes are accumulated in a pinch-off region of an ordinary U-shaped channel SOI-LIGBT device, which raises a voltage of the pinch-off region. When the voltage at the pinch-off region is higher than a gate voltage, a gate displacement current is generated. The gate displacement current charges a gate capacitance, causing the gate voltage to overshoot, and an excessively high gate voltage causes a peak value of a turn-on current to be excessively high.

Compared with the ordinary U-shaped channel SOI-LIGBT device, the present invention greatly reduces a peak value of a turn-on overshoot current. In the present invention, the gate is divided into two parts: a first gate and a second gate. The first gate is U-shaped and is located above the N-type emitter region, the P-type well region, the P-type body region, and the N-type drift region, and does not go deep into the pinch-off region. The second gate is located above the pinch-off region. The first gate is connected to the first polysilicon resistor, and the resistance value of the first polysilicon transistor is 100Ω to 5000Ω. The second gate is connected to the second polysilicon resistor, and the resistance value of the second polysilicon transistor is 1Ω to 100Ω. The first gate and the second gate are connected to different resistors to isolate the voltage. In a rising phase of a second gate pulse signal, the greater the resistance value of the first polysilicon resistor is, the slower the voltage of the first gate rises, the slower the current of the device grows, the slower holes in the pinch-off region are accumulated, and the smaller a voltage rise rate of the pinch-off region is. The smaller the resistance value of the second polysilicon is, the faster the voltage of the second gate rises. Furthermore, when the resistance value of the first gate resistor is greater than 10 times the resistance value of the second gate resistor, a voltage rise rate of the second gate is greater than a voltage rise rate of the pinch-off region. In the rising phase of the second gate pulse signal, the voltage of the second gate is always greater than a surface voltage of the pinch-off region, and no gate displacement current is generated. The invention suppresses generation of the gate displacement current by adjusting the resistance values of the first gate resistor and the second gate resistor, to ensure that the voltage of the second gate is always greater than the voltage of the pinch-off region. Therefore, the present invention has no gate voltage overshoot, and compared with the ordinary U-shaped channel SOI-LIGBT device, greatly reduces the peak value of the turn-on overshoot current.

Compared with the ordinary U-shaped channel SOI-LIGBT device, the current capability of the present invention is not degraded. A gate of the ordinary U-shaped channel SOI-LIGBT device is located above an N-type emitter region, a P-type well region, a P-type body region, and an N-type drift region, and covers a pinch-off region. When a voltage is applied to the gate, upper surfaces of the P-type well region and the P-type body region are inverted, to form a channel connecting the N-type emitter region and the N-type drift region, thereby turning on the device; and an electron accumulation layer is formed on an upper surface of the pinch-off region, thereby reducing the on-resistance. In the present invention, the gate is divided into two parts: a first gate and a second gate. The first gate is U-shaped and is located above the N-type emitter region, the P-type well region, the P-type body region, and the N-type drift region, and does not go deep into the pinch-off region. The second gate is located above the pinch-off region. When a voltage is applied to the first gate, surfaces of the P-type well region and the P-type body region under the first gate are inverted to form a channel. When a voltage is applied to the second gate, a surface of the pinch-off region under the second gate forms an accumulation layer. The structure of the present invention retains the gate function of the ordinary U-shaped channel SOI-LIGBT device without affecting the current capability of the device.

The present invention does not require an additional driving circuit. In the present invention, the gate is divided into a first gate and a second gate, where the first gate is connected to the first polysilicon resistor, and the second gate is connected to the second polysilicon resistor. The first polysilicon resistor and the second polysilicon resistor are connected to the third peripheral terminal through metal wires. A gate signal is applied to the third peripheral terminal to drive the first and second gates.

Compared with the ordinary U-shaped channel SOI-LIGBT device, the present invention has a higher response speed. A gate of the ordinary U-shaped channel SOI-LIGBT device is located above an N-type emitter region, a P-type well region, a P-type body region, and an N-type drift region, and covers a pinch-off region. When the gate voltage rises, it is necessary to form a channel in the P-type well region and the P-type body region, and an accumulation layer on the pinch-off region. The on-current of the device rises slowly with the gate voltage, and a transconductance is small. In the present invention, the gate is divided into a first gate and a second gate, where the first gate is connected to the first polysilicon resistor, and the second gate is connected to the second polysilicon resistor. The resistance value of the first polysilicon resistor is 100Ω to 5000Ω, and the resistance value of the second polysilicon resistor is 1Ω to 100Ω. When the gate signal is applied, because the resistance value of the second polysilicon resistor is small, the voltage of the second gate rises rapidly and reaches a preset value before the first gate, to form an accumulation layer. After the voltage of the second gate reaches the preset value, it is only necessary to form a channel on the surface of the P-type well region and the P-type body region when the voltage of the first gate rises. The device of the present invention has an on-current that rises fast with the voltage of the first gate, a large transconductance, and a high response speed.

The structure of the invention is simple to manufacture and easy to realize in terms of processes. The first gate and the second gate of the present invention may be formed by using a same mask without requiring an additional process step, so that manufacturing costs are low.

DETAILED DESCRIPTION

Figure 1:
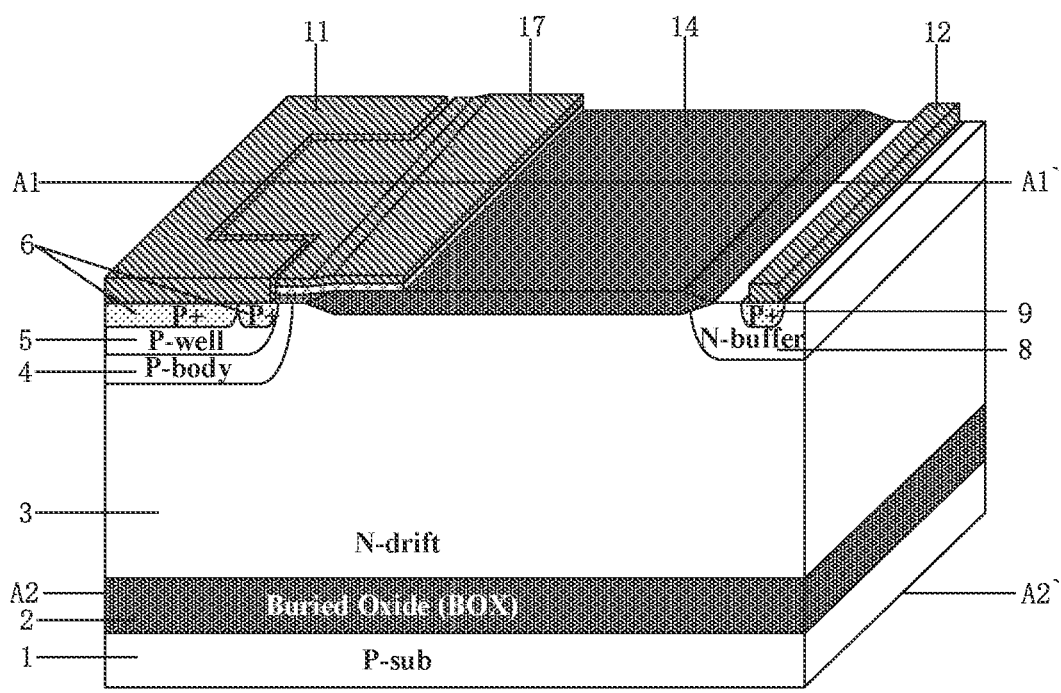
FIG. 1 is a three-dimensional view of an ordinary U-shaped channel SOI-LIGBT device.
Figure 2:
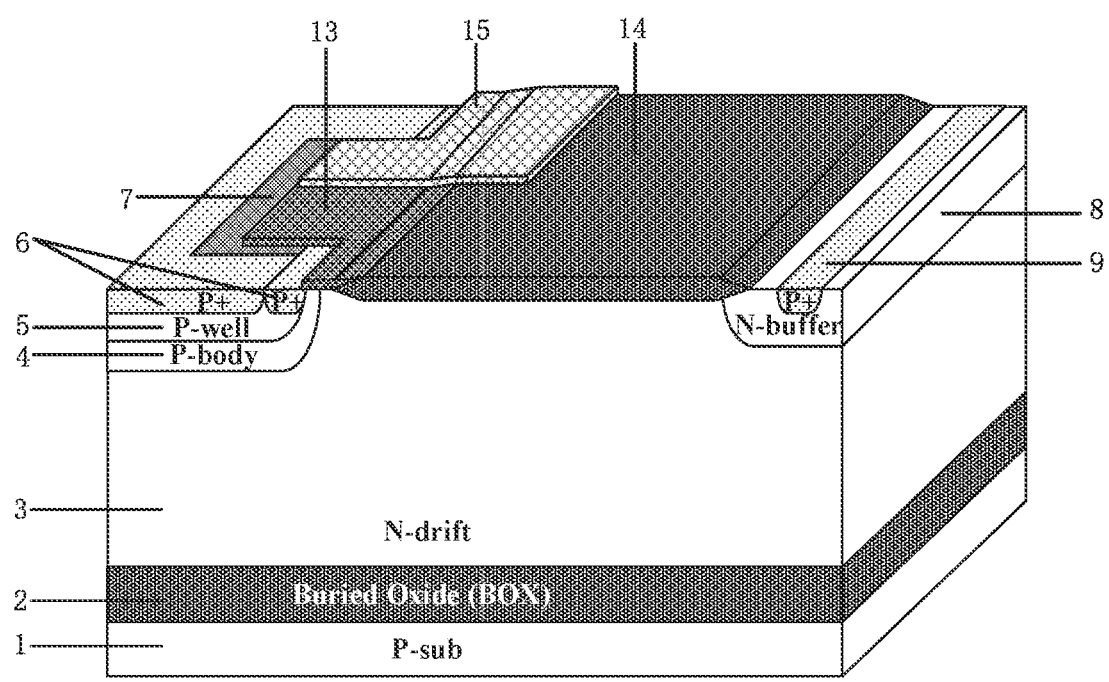
FIG. 2 is a three-dimensional view of an ordinary U-shaped channel SOI-LIGBT device after a metal electrode and a half of a polysilicon gate are removed.
Figure 3:
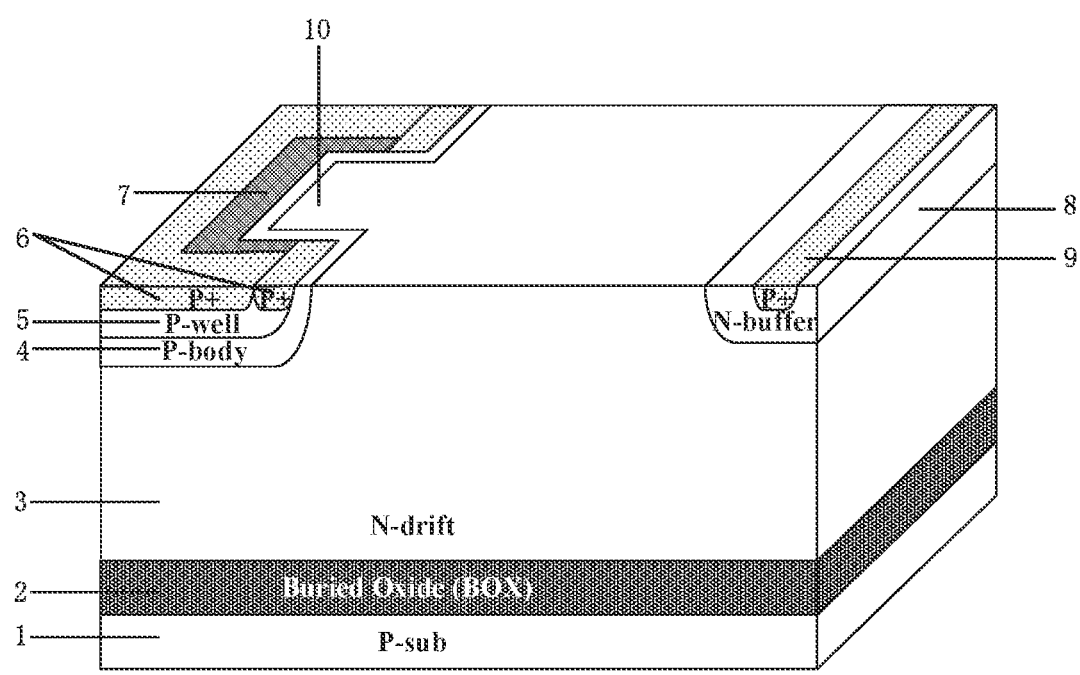
FIG. 3 is a three-dimensional view of an ordinary U-shaped channel SOI-LIGBT device after a metal electrode, a polysilicon gate, and an oxide layer are removed.
Figure 4:
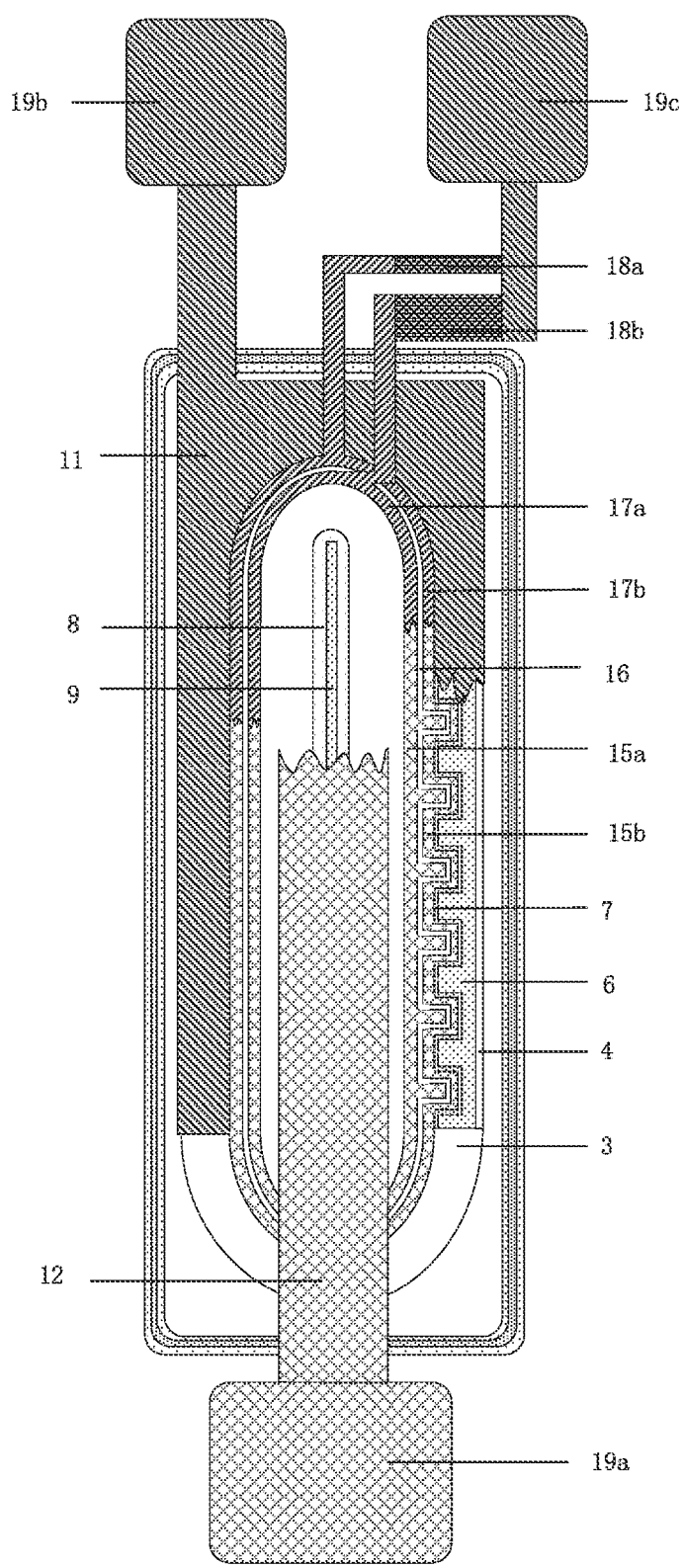
FIG. 4 is a structural view of a partially etched top layer of a structure of the present invention.
Figure 5:
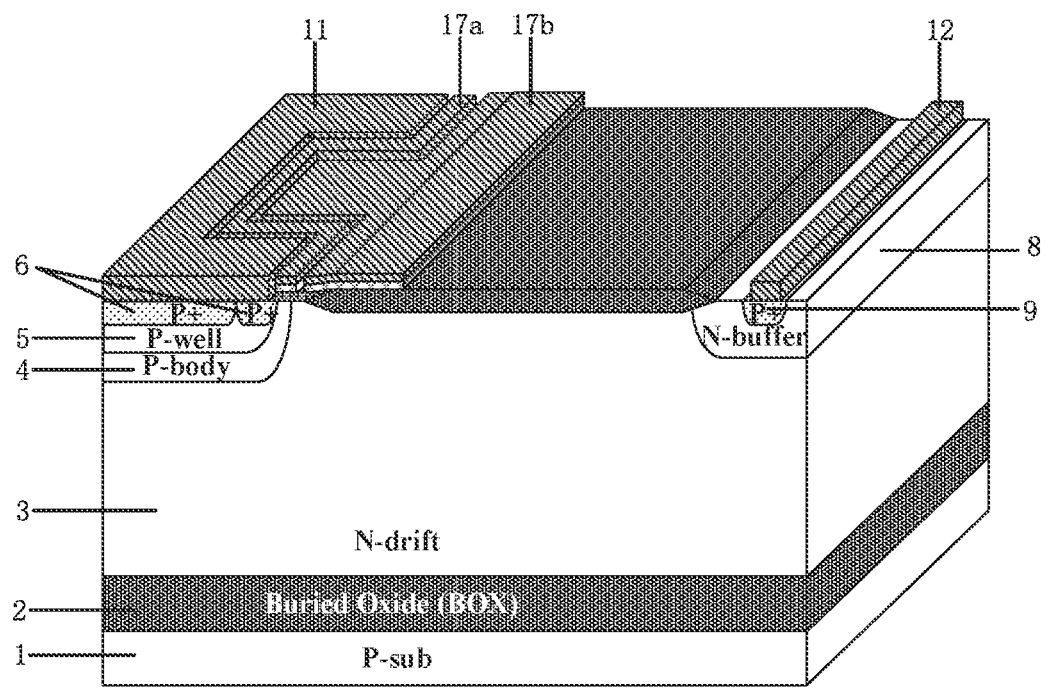
FIG. 5 is a three-dimensional view of a structure of the present invention.
Figure 6:
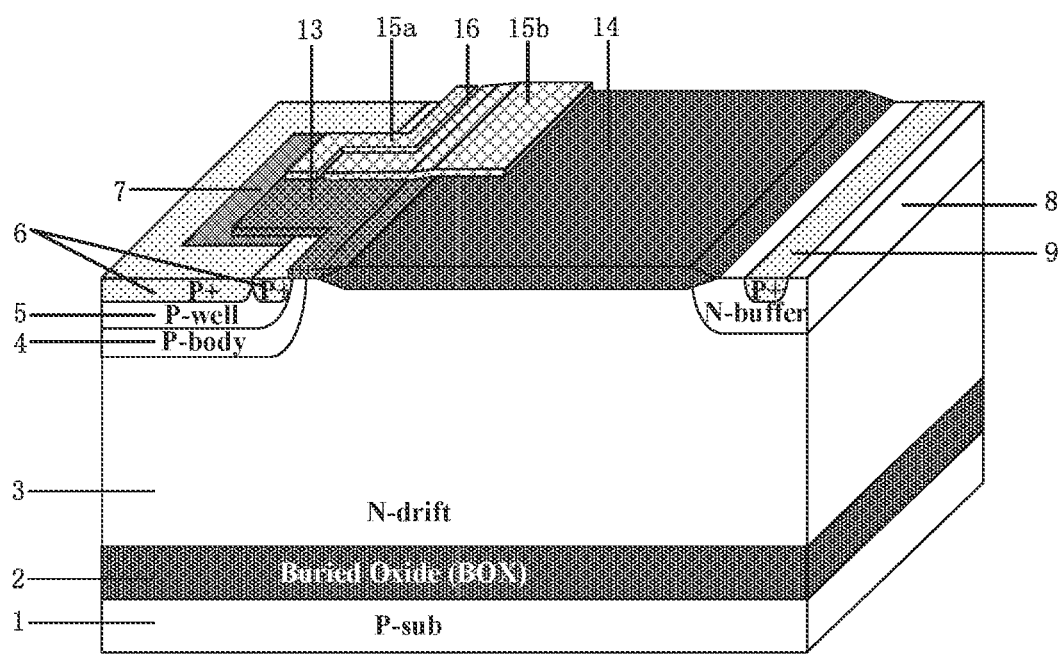
FIG. 6 is a three-dimensional view of a structure of the present invention after a metal electrode and a half of a polysilicon gate are removed.
Figure 7:
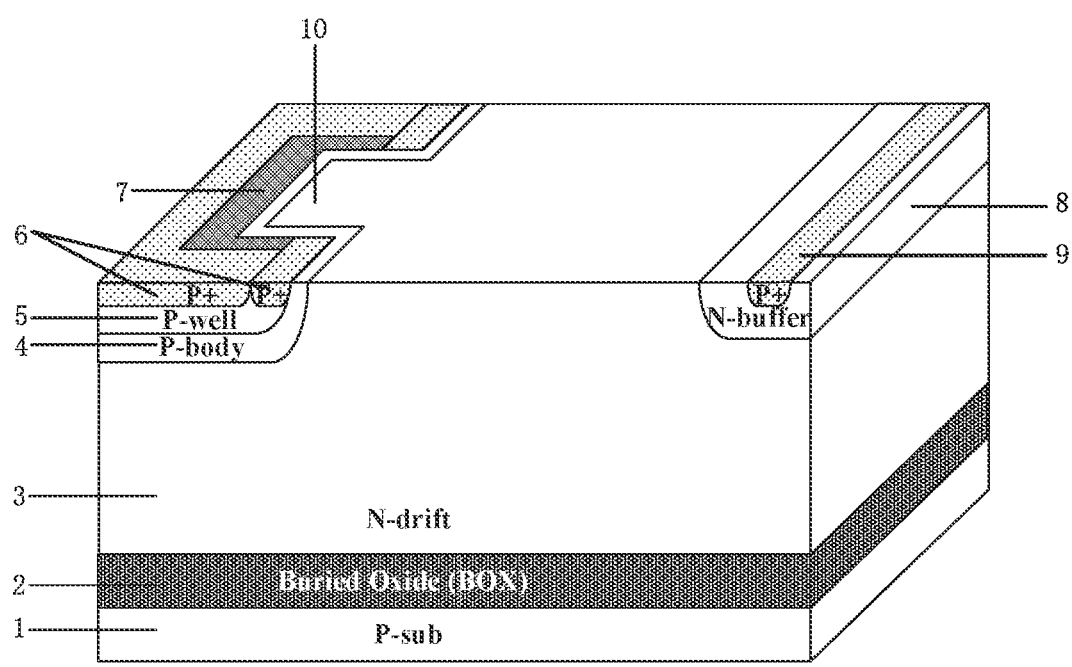
FIG. 7 is a three-dimensional view of a structure of the present invention after a metal electrode, a polysilicon gate, and an oxide layer are removed.

The following describes the present invention in detail with reference to FIG. 4, FIG. 5, FIG. 6, and FIG. 7:

A lateral IGBT with a low turn-on overshoot current is provided, including: a P-type substrate 1, where a buried oxide layer 2 is arranged on the P-type substrate 1, an N-type drift region 3 is arranged on the buried oxide layer 2, a P-type body region 4 and an N-type buffer region 8 are respectively arranged on both sides of the N-type drift region 3, a field oxide layer 14 is arranged above the N-type drift region 3, a heavily doped P-type collector region 9 is arranged in the N-type buffer region 8, a collector metal 12 is connected to the heavily doped P-type collector region 9, the collector metal 12 is connected to a first peripheral terminal 19a, a P-type well region 5 is arranged in the P-type body region 4, a heavily doped P-type emitter region 6 and a heavily doped N-type emitter region 7 are arranged in the P-type well region 5, the heavily doped P-type emitter region 6 and the heavily doped N-type emitter region 7 are connected to an emitter metal 11, the emitter metal 11 is connected to a second peripheral terminal 19b, and inner boundaries of the P-type body region 4, the P-type well region 5, the heavily doped P-type emitter region 6, and the heavily doped N-type emitter region 7 are synchronously recessed to form a pinch-off region 10; a gate oxide layer 13 is arranged on a surface of the P-type body region 4, the gate oxide layer 13 extends into an upper part of the N-type drift region 3 and covers the pinch-off region 10, where a polysilicon gate 15 is arranged on the gate oxide layer 13, and the polysilicon gate 15 includes a first gate 15a located above the surface of the P-type body region 4 and a second gate 15b located above the pinch-off region 10 and the N-type drift region 3, a gap 16 is arranged between the first gate 15a and the second gate 15b, and the first gate 15a and the second gate 15b are separated by the gap 16; the first gate 15a is covered with a first gate metal 17a, and the first gate metal 17a is connected to a third peripheral terminal 19c through a first polysilicon resistor 18a; and the second gate 15b is covered with a second gate metal 17b, and the second gate metal 17b is connected to the third peripheral terminal 19c through a second polysilicon resistor 18b.

A width of the gap 16 is 0.5 to 1.5 um.

A resistance value of the first polysilicon resistor 18a is 100Ω to 5000Ω, a resistance value of the second polysilicon resistor 18b is 1Ω to 100Ω, and the resistance value of the first polysilicon resistor 18a is greater than 10 times the resistance value of the second polysilicon resistor 18b.

The gap 16 is filled with an insulating medium.

The following further describes the present invention with reference to the accompanying drawings.

Figure 8:
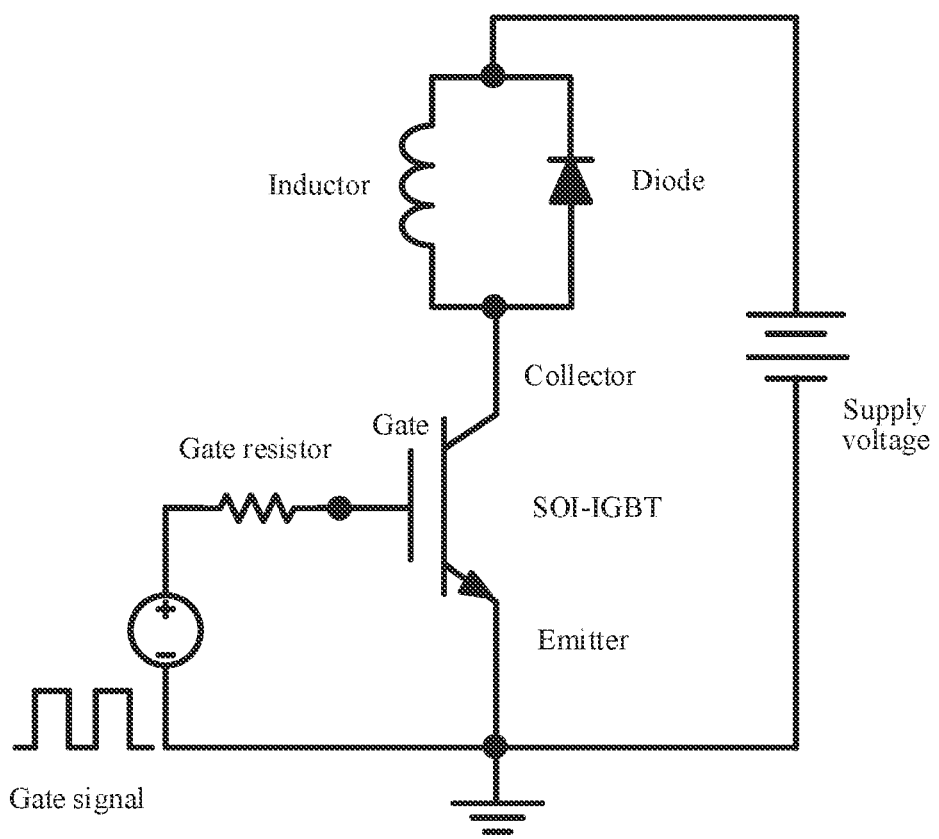
FIG. 8 is a circuit diagram of a double pulse test.

The present invention has the following working principle:

In a circuit diagram shown in FIG. 8, during a first gate pulse signal of a double pulse gate signal, a positive bias is applied to a gate of the device, and an N-type channel connecting the N-type emitter region and the N-type drift region is formed under the gate. The device is in an on state, the current gradually rises to a preset value, and a current on an inductor is equal to a current flowing through the device. The collector voltage drops from a supply voltage to a turn-on voltage, and a diode is in a blocking state to withstand the supply voltage. After the first gate pulse signal and before the second gate pulse signal, no voltage is applied to the gate of the device, the channel disappears, the device is in a blocking state, the collector voltage rises to the supply voltage, and the diode is no longer in a reverse bias state. Because the current on the inductor cannot change abruptly, the current flowing through the device during the first gate pulse is transferred to an inductor-diode loop. In the second rising phase of the gate pulse, the channel is formed, the device is turned on, the collector voltage drops to the turn-on voltage, and the diode quickly switches from the on-state to an off-state to withstand the supply voltage. The diode changes from the on state to the blocking state, which needs to drain internal electrons and holes to form a depletion layer. The process will generate an additional current, which is referred to as a reverse recovery current. The reverse recovery current, together with the current stored in the inductor-diode loop, is transferred to the device, causing the turn-on current of the device to rise rapidly.

Figure 9:
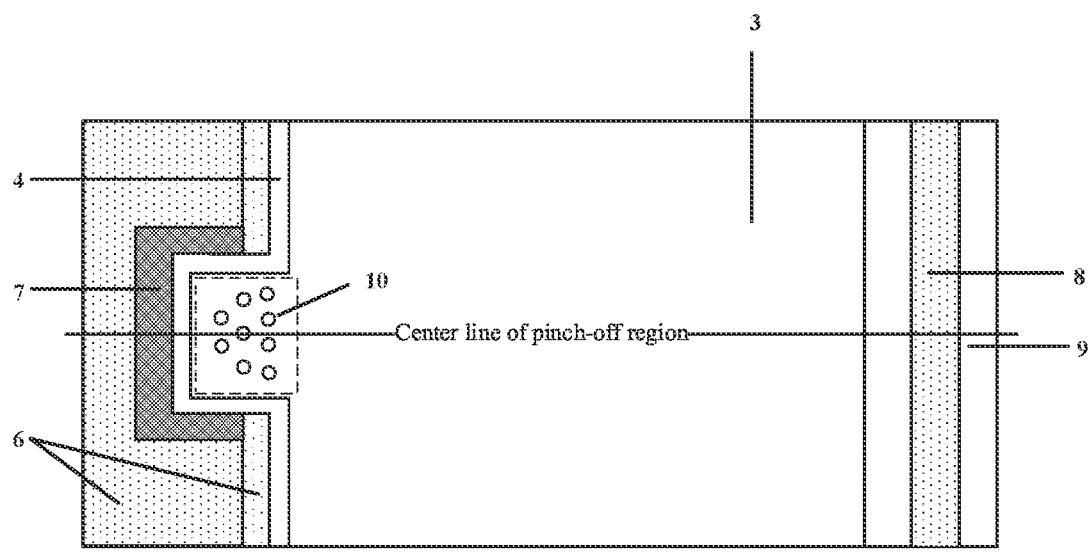
FIG. 9 is a schematic diagram of hole accumulation.
Figure 10:
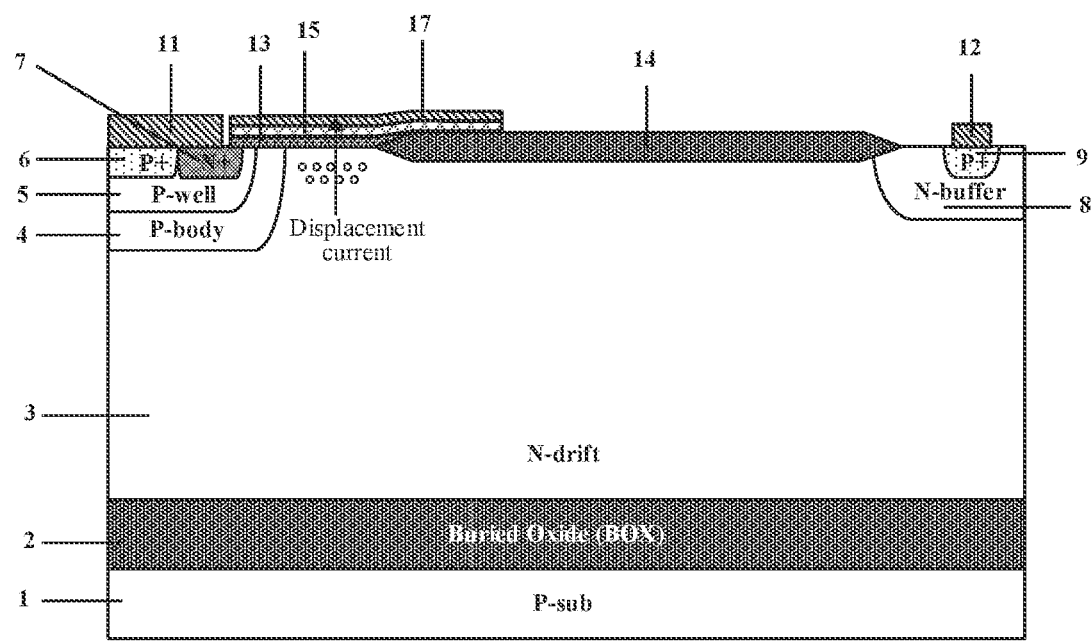
FIG. 10 is a schematic diagram of generation of a displacement current of an ordinary U-shaped channel SOI-LIGBT device, which is a cross-sectional view along a line A1-A1' to a line A2-A2' (a center line of a pinch-off region) in FIG. 1.
Figure 11:
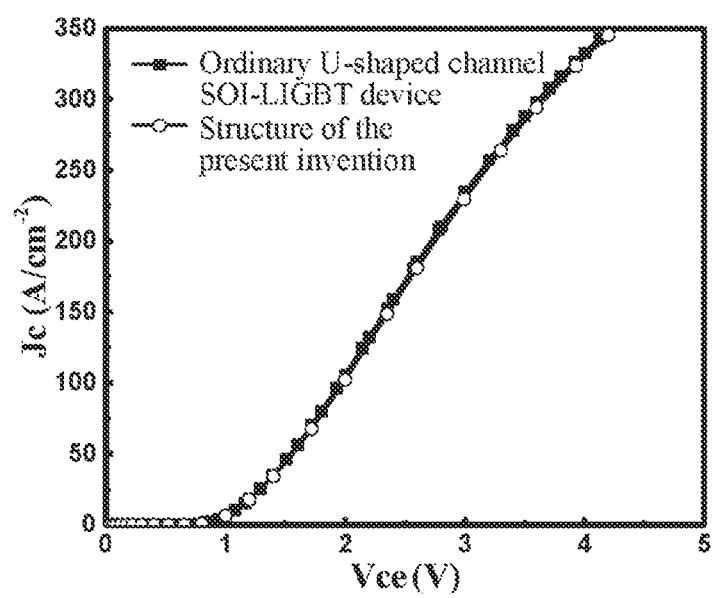
FIG. 11 is a comparison diagram of an I-V curve between a structure of the present invention and an ordinary U-shaped channel SOI-LIGBT device.
Figure 12:
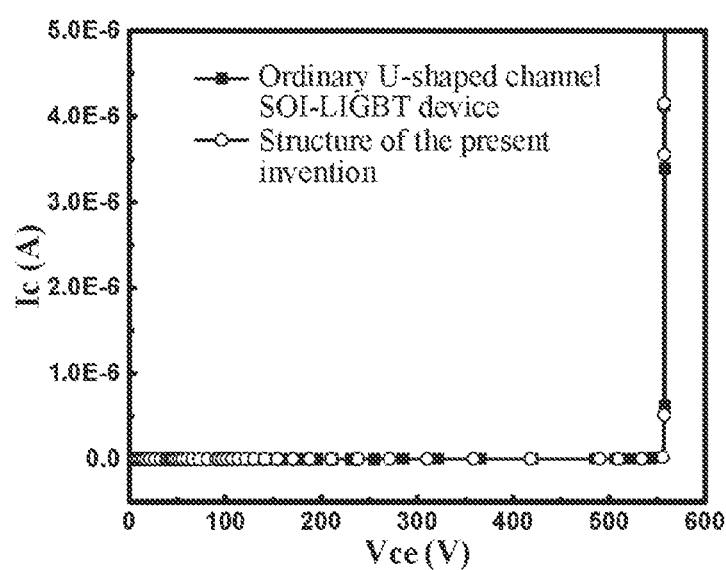
FIG. 12 is a comparison diagram of a withstand voltage curve between a structure of the present invention and an ordinary U-shaped channel SOI-LIGBT device.
Figure 13:
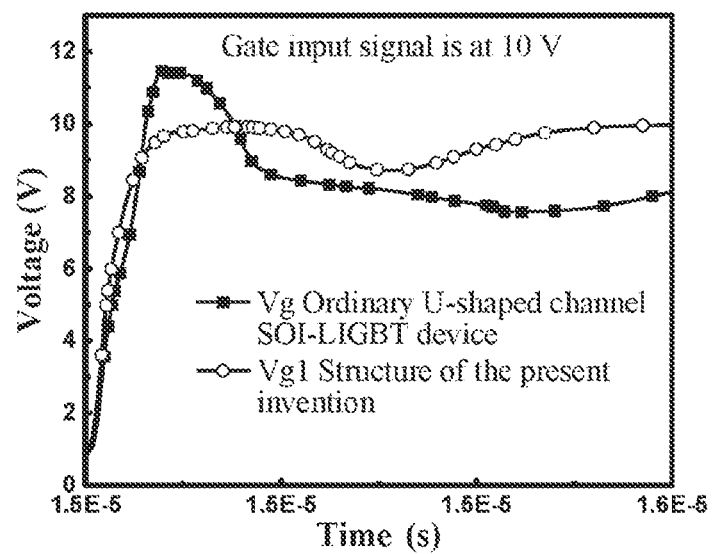
FIG. 13 is a comparison diagram of a gate voltage curve between a structure of the present invention and an ordinary U-shaped channel SOI-LIGBT device during turn-on of a second gate pulse.
Figure 14:
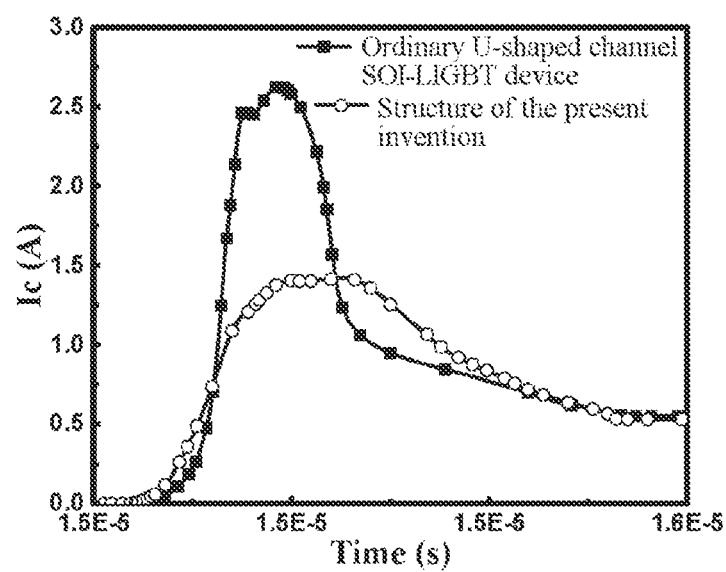
FIG. 14 is a comparison diagram of a current curve between a structure of the present invention and an ordinary U-shaped channel SOI-LIGBT device during turn-on of a second gate pulse.
Figure 15:
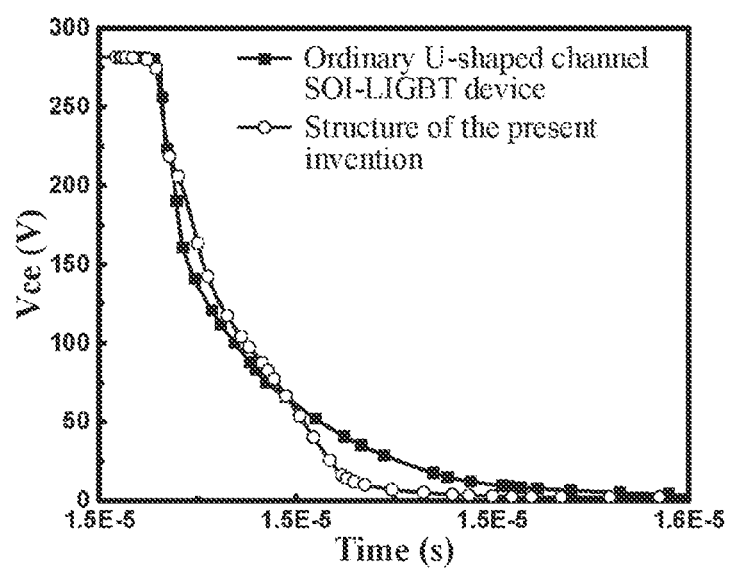
FIG. 15 is a comparison diagram of a collector voltage curve between a structure of the present invention and an ordinary U-shaped channel SOI-LIGBT device during turn-on of a second gate pulse.

As shown in FIG. 9 and FIG. 10, for an ordinary U-shaped channel SOI-LIGBT device, in a second rising phase of a gate pulse signal, the gate pulse signal charges a gate capacitance through a gate resistor, causing a gate voltage to rise. When the gate voltage exceeds a threshold voltage, a channel is formed, and the device is turned on. A reverse recovery current of a diode, together with a current stored in an inductor-diode loop, is transferred to the device, a current flowing through the device rises rapidly, and holes injected from a collector are accumulated in a pinch-off region, which quickly raises a voltage of the pinch-off region. A voltage rise rate of the pinch-off region is greater than a gate voltage rise rate. When the voltage of the pinch-off region is higher than the gate voltage, a gate displacement current is generated, causing the gate voltage to overshoot. As the gate voltage rises, a quantity of electrons flowing from an N-type emitter increases, and a quantity of holes flowing from a P-type collector region increases accordingly, and the current of the device rises. Therefore, the gate voltage overshoot causes a current peak value of the device to be excessively high during turn on of a second pulse. An excessively high current peak value may increase the turn-on loss of the device, and even cause latch-up and damage the device.

In the present invention, the gate is divided into two parts: a first gate and a second gate. The first gate is U-shaped and is located above the N-type emitter region, the P-type body region, and the N-type drift region, and does not go deep into the pinch-off region. The second gate is located above the pinch-off region. The first gate and the second gate are connected to different resistors to isolate the voltage. The first gate is connected to the first polysilicon resistor, and the resistance value of the first polysilicon transistor is 100Ω to 5000Ω. The second gate is connected to the second polysilicon resistor, and the resistance value of the second polysilicon transistor is 1Ω to 100Ω. In a rising phase of a second gate pulse signal, the greater the resistance value of the first polysilicon resistor is, the slower the voltage of the first gate rises, the slower the current of the device grows, the slower holes in the pinch-off region are accumulated, and the smaller a voltage rise rate of the pinch-off region is. The smaller the resistance value of the second polysilicon is, the faster the voltage of the second gate rises. When the resistance value of the first gate resistor is greater than 10 times the resistance value of the second gate resistor, a voltage rise rate of the second gate is greater than a voltage rise rate of the pinch-off region. In the rising phase of the second gate pulse signal, the voltage of the second gate is always greater than a surface voltage of the pinch-off region, and no gate displacement current is generated. Therefore, the present invention has no gate voltage overshoot, and compared with the ordinary U-shaped channel SOI-LIGBT device, greatly reduces the peak value of the turn-on overshoot current.

A gate of the ordinary U-shaped channel SOI-LIGBT device is located above an N-type emitter region, a P-type well region, a P-type body region, and an N-type drift region, and covers a pinch-off region. When a voltage is applied to the gate, upper surfaces of the P-type well region and the P-type body region are inverted, to form a channel connecting the N-type emitter region and the N-type drift region, thereby turning on the device; and an electron accumulation layer is formed on an upper surface of the pinch-off region, thereby reducing the on-resistance. In the present invention, the gate is divided into a first gate and a second gate, where the first gate is connected to the first polysilicon resistor, and the second gate is connected to the second polysilicon resistor. The first polysilicon resistor and the second polysilicon resistor are connected to the third peripheral terminal through metal wires. A gate signal is applied to the third peripheral terminal to drive the first and second gates without requiring an additional signal source. The first gate is U-shaped and is located above the N-type emitter region, the P-type well region, the P-type body region, and the N-type drift region, and does not go deep into the pinch-off region. The second gate is located above the pinch-off region. When a voltage is applied to the first gate, surfaces of the P-type well region and the P-type body region under the first gate are inverted to form a channel. When a voltage is applied to the second gate, a surface of the pinch-off region under the second gate forms an accumulation layer. The structure of the invention retains the function of an original gate structure, and compared with an ordinary U-shaped channel SOI-LIGBT device, does not affect the current capability of the device.

A gate of the ordinary U-shaped channel SOI-LIGBT device is located above an N-type emitter region, a P-type well region, a P-type body region, and an N-type drift region, and covers a pinch-off region. When the gate voltage rises, it is necessary to form a channel in the P-type well region and the P-type body region, and an accumulation layer on the pinch-off region. The on-current of the device rises slowly with the gate voltage, and a transconductance is small. In the present invention, the first gate is connected to the first polysilicon resistor, and the second gate is connected to the second polysilicon resistor. The resistance value of the first polysilicon resistor is 100Ω to 5000Ω, and the resistance value of the second polysilicon resistor is 1Ω to 100Ω. When the gate signal is applied, because the resistance value of the second polysilicon resistor is small, the voltage of the second gate rises rapidly and reaches a preset value before the first gate, to form an accumulation layer. After the voltage of the second gate reaches the preset value, it is only necessary to form a channel on the surface of the P-type well region and the P-type body region when the voltage of the first gate rises. Therefore, the device of the present invention has an on-current that rises fast with the voltage of the first gate, a large transconductance, and a high response speed.

What is claimed is:

1. A lateral insulated gate bipolar transistor (IGBT) with a low turn-on overshoot current, comprising: a P-type substrate (1), wherein a buried oxide layer (2) is arranged on the P-type substrate (1), an N-type drift region (3) is arranged on the buried oxide layer (2), a P-type body region (4) and an N-type buffer region (8) are respectively arranged on both sides of the N-type drift region (3), a field oxide layer (14) is arranged above the N-type drift region (3), a heavily doped P-type collector region (9) is arranged in the N-type buffer region (8), a collector metal (12) is connected to the heavily doped P-type collector region (9), the collector metal (12) is connected to a first peripheral terminal (19a), a P-type well region (5) is arranged in the P-type body region (4), a heavily doped P-type emitter region (6) and a heavily doped N-type emitter region (7) are arranged in the P-type well region (5), the heavily doped P-type emitter region (6) and the heavily doped N-type emitter region (7) are connected to an emitter metal (11), the emitter metal (11) is connected to a second peripheral terminal (19b), and inner boundaries of the P-type body region (4), the P-type well region (5), the heavily doped P-type emitter region (6), and the heavily doped N-type emitter region (7) are synchronously recessed to form a pinch-off region (10); a gate oxide layer (13) is arranged on a surface of the P-type body region (4), and the gate oxide layer (13) extends into an upper part of the N-type drift region (3) and covers the pinch-off region (10), wherein a polysilicon gate (15) is arranged on the gate oxide layer (13), and the polysilicon gate (15) comprises a first gate (15a) located above the surface of the P-type body region (4) and a second gate (15b) located above the pinch-off region (10) and the N-type drift region (3), a gap (16) is arranged between the first gate (15a) and the second gate (15b), and the first gate (15a) and the second gate (15b) are separated by the gap (16); the first gate (15a) is covered with a first gate metal (17a), and the first gate metal (17a) is connected to a third peripheral terminal (19c) through a first polysilicon resistor (18a); and the second gate (15b) is covered with a second gate metal (17b), and the second gate metal (17b) is connected to the third peripheral terminal (19c) through a second polysilicon resistor (18b).

2. The lateral IGBT with a low turn-on overshoot current according to claim 1, wherein a width of the gap (16) is 0.5 to 1.5 um.

3. The lateral IGBT with a low turn-on overshoot current according to claim 1, wherein a resistance value of the first polysilicon resistor (18a) is 100Ω to 5000Ω, a resistance value of the second polysilicon resistor (18b) is 1Ω to 100Ω, and the resistance value of the first polysilicon resistor (18a) is greater than 10 times the resistance value of the second polysilicon resistor (18b).

4. The lateral IGBT with a low turn-on overshoot current according to claim 1, wherein the gap (16) is filled with an insulating medium.

* * * * *